US009496382B2

(12) United States Patent
Li et al.

(10) Patent No.: US 9,496,382 B2
(45) Date of Patent: Nov. 15, 2016

(54) FIELD EFFECT TRANSISTOR, TERMINATION STRUCTURE AND ASSOCIATED METHOD FOR MANUFACTURING

(71) Applicant: Chengdu Monolithic Power Systems Co., Ltd., Chengdu (CN)

(72) Inventors: Tiesheng Li, San Jose, CA (US); Rongyao Ma, Chengdu (CN)

(73) Assignee: CHENGDU MONOLITHIC POWER SYSTEMS CO., LTD., Chengdu (CN)

( * ) Notice: Subject to any disclaimer, the term of this patent is extended or adjusted under 35 U.S.C. 154(b) by 50 days.

(21) Appl. No.: 14/086,884

(22) Filed: Nov. 21, 2013

(65) Prior Publication Data

US 2015/0137220 A1    May 21, 2015

(51) Int. Cl.
| | |
|---|---|
| H01L 29/772 | (2006.01) |
| H01L 29/78 | (2006.01) |
| H01L 21/768 | (2006.01) |
| H01L 21/8234 | (2006.01) |
| H01L 27/088 | (2006.01) |
| H01L 29/06 | (2006.01) |
| H01L 29/423 | (2006.01) |
| H01L 29/66 | (2006.01) |
| H01L 29/40 | (2006.01) |

(52) U.S. Cl.
CPC ..... *H01L 29/7811* (2013.01); *H01L 21/76802* (2013.01); *H01L 21/76831* (2013.01); *H01L 21/76877* (2013.01); *H01L 21/823475* (2013.01); *H01L 27/088* (2013.01); *H01L 29/0619* (2013.01); *H01L 29/0623* (2013.01); *H01L 29/407* (2013.01); *H01L 29/4236* (2013.01); *H01L 29/4238* (2013.01); *H01L 29/6656* (2013.01); *H01L 29/66734* (2013.01); *H01L 29/7813* (2013.01); *H01L 29/7841* (2013.01); *H01L 29/66712* (2013.01); *H01L 29/7802* (2013.01)

(58) Field of Classification Search
CPC .......... H01L 29/7811; H01L 29/7813; H01L 29/7802
See application file for complete search history.

(56) References Cited

U.S. PATENT DOCUMENTS

| | | | | |
|---|---|---|---|---|
| 5,468,982 | A * | 11/1995 | Hshieh | H01L 29/0696 257/331 |
| 8,017,494 | B2 * | 9/2011 | Ma | H01L 29/407 257/E21.359 |
| 2011/0227152 | A1 * | 9/2011 | Hsu | H01L 29/66143 257/334 |

* cited by examiner

*Primary Examiner* — Matthew Landau
*Assistant Examiner* — Scott Stowe

(57) ABSTRACT

The present disclosure discloses a field effect transistor ("FET"), a termination structure and associated method for manufacturing. The termination structure for the FET includes a plurality of termination cells arranged substantially in parallel from an inner side toward an outer side of a termination area of the FET. Each of the termination cells comprises a termination trench and a guard ring region located underneath the bottom of the termination trench in the semiconductor layer. Each termination trench is lined with a termination insulation layer, and is filled with a first conductive spacer and a second conductive spacer respectively against an inner sidewall and an outer sidewall of the termination trench and spaced apart from each other with a space, and a dielectric layer filling the space between the first and the second spacers.

10 Claims, 14 Drawing Sheets

FIELD EFFECT TRANSISTOR, TERMINATION STRUCTURE AND ASSOCIATED METHOD FOR MANUFACTURING

TECHNICAL FIELD

This disclosure relates generally to semiconductor devices, and particularly but not exclusively relates to field effect transistors ("FETs").

BACKGROUND

Field effect transistors ("FETs"), such as metal oxide semiconductor field effect transistors ("MOSFETs"), junction field effect transistors ("JFETs"), and double diffused metal-oxide semiconductor (DMOS) transistors etc. are widely used in various electronic products. In certain application circumstances, for example, in power management applications, when the FETs are used as switching elements in power supplies, it is generally desired that the FETs have relatively low on resistance, relatively high breakdown voltage, good current handling capability and good ruggedness.

A field effect transistor ("FET") may generally be fabricated on a semiconductor substrate and include a core active area and a termination area. The core active area usually comprises at least one FET cell having a gate, a drain region, and a source region. The gate regulates the conduction and blocking of a channel region in the substrate to control an electrical current flow between the drain region and the source region. The termination area should comprise at least one termination cell which serves to isolate the core active area from the termination area, to block undesired electrical leakage path from the termination area to the core active area, and to improve the breakdown voltage (i.e. the maximum drain to source voltage that the FET can assume without breakdown in its OFF state) of the FET. Increasing the number of FET cells formed in the core active area is beneficial to reducing the on resistance and improving the current handling ability of the FET. In the meanwhile, improving the isolation performance and voltage withstand properties of the termination cell(s) formed in the termination area is beneficial to increasing the breakdown voltage and ruggedness of the FET.

Conventionally, a guard ring with an opposite conductive type to that of the substrate may be formed in the termination area and function as a termination cell. However, a guard ring termination cell may occupy a relatively large area, which renders a decrease in size of the core active area and the number of active FET cells that can be formed in the active area, while still have relatively poor isolation performance. Furthermore, forming a guard ring termination cell requires an extra implantation mask, which increases manufacturing complexity and cost.

As an alternative to the guard ring termination cell, a trenched termination cell may be formed in the termination area. To provide an example, FIG. 1 illustrates a cross-sectional view of a trench-gate FET 10 having trenched termination cells. The FET 10 is fabricated on an N type semiconductor substrate 101 having an active area 102 and a termination area 103. In the active area 102, FET cells having trenched gates 104, N+ type source regions 105 and P type body regions 106 are formed in the N type semiconductor substrate 101 that functions as a drain region of the FET 10. The trenched gates 104 are electrically connected to each other. The electrical connection of the trenched gates 104 is illustrated by a dotted line in FIG. 1. In the termination area 103, a trenched gate contact 107 is formed. The trenched gate contact 107 is electrically connected (the electrical connection still illustrated by a dotted line) to the trenched gates 104 and has a wider trench width than the trenched gates 104 to facilitate connection to a gate metal 108. In the termination area 103, a plurality of trenched termination cells 109 are further formed to protect the FET cells in the active area 102. However, the trenched termination cells 109, especially the innermost one (the one closest to the active cell area 102) may be vulnerable to high drain to source voltage, and may lead to break-down voltage walk-out (i.e. deviation of break-down voltage from designed value) of the FET 10, which is undesirable. FIG. 2 illustrates a simulated equal potential line distribution diagram of a portion of the trenched termination cells 109 (e.g. a portion corresponding to the BB' area in FIG. 1) in the FET 10 shown in FIG. 1 when the FET 10 is OFF and a high drain to source voltage (e.g. 30V) is applied between the drain region 101 and the source region 105. It can be seen from FIG. 2 that the equal potential lines near the left side (e.g. the portion looped by the dotted ellipse) of the innermost trenched termination cell 109 are relatively intensive/close-spaced in comparison with those of other areas, which indicates that the electric field intensity near the left side of the innermost trenched termination cell 109 is very high. Such a high electric field intensity causes the innermost trenched termination cell 109 suffer from high voltage pressure, and may lead to walk-out or decrease in break-down voltage of FET 10 or even result in punch-through of a thin oxide layer lining the sidewalls of the trenched termination cell 109, and inducing damage to the FET 10. In addition, in practical application, since the innermost trenched termination cell 109 may suffer from high voltage pressure over and over again during on and off switching of the FET 10, the ruggedness and lifetime of the FET 10 may decrease.

SUMMARY

In view of the above requirements, there has been provided, in accordance with an embodiment of the present disclosure, a field effect transistor. The field effect transistor may have an active area and a termination area outside of the active area, and may include a semiconductor layer of a first conductivity type, a plurality of active transistor cells formed in the semiconductor layer in the active area, a plurality of floating body regions of a second conductivity type disposed in the semiconductor layer in the termination area, and a plurality of termination cells disposed interleaving with the plurality of floating body regions in the termination area, and arranged substantially in parallel from an inner side toward an outer side of the termination area. Each of the transistor cells may have a drain region of the first conductivity type, a source region of the first conductivity type, an active body region of the second conductivity type and a gate region, wherein the source region is located in the active body region and laterally adjacent to both sides of the gate region. Each of the termination cells may include a termination trench opened from a top surface of said semiconductor layer and having sidewalls and a bottom, wherein the termination trench includes a termination insulation layer lining the termination trench sidewalls and bottom, a first conductive spacer and a second conductive spacer located respectively against an inner sidewall and an outer sidewall among the termination trench sidewalls and spaced apart from each other, and a dielectric layer filling the space between the first conductive spacer and the second conductive spacer. Each of the termination cells may further include a guard ring region of the second conductivity type located underneath the bottom of the termination trench in the semiconductor layer.

There has also been provided, in accordance with an embodiment of the present disclosure, a termination structure for a field effect transistor. The field effect transistor may include a semiconductor layer of a first conductivity type having an active area and a termination area outside of the active area. The termination structure may have a plurality of floating body regions and a plurality of termination cells. The floating body regions may have a second conductivity type and are disposed in the termination area of the semiconductor layer. The plurality of termination cells may be disposed interleaving with the plurality of floating body regions in the termination area, and are arranged substantially in parallel from an inner side toward an outer side of the termination area. Each of the termination cells may comprise a termination trench opened from a top surface of said semiconductor layer and having sidewalls and a bottom, wherein the termination trench includes a termination insulation layer lining the termination trench sidewalls and bottom, a first conductive spacer and a second conductive spacer located respectively against an inner sidewall and an outer sidewall among the termination trench sidewalls and spaced apart from each other with a space, and a dielectric layer filling the space between the first conductive spacer and the second conductive spacer. Each of the termination cells may further comprise a guard ring region of the second conductivity type located underneath the bottom of the termination trench in the semiconductor layer.

In addition, there has been provided, in accordance with an embodiment of the present disclosure, a method of forming a field effect transistor. The method may comprise: providing a semiconductor layer of a first conductivity type, wherein the semiconductor layer includes an active area and a termination area outside of the active area; forming a plurality of gate regions in the active area; forming a plurality of termination trenches in the termination area, wherein the termination trenches are opened from a top surface of the semiconductor layer and are arranged substantially in parallel from an inner side toward an outer side of the termination area, and wherein each of the termination trenches has sidewalls and a bottom, and wherein forming the termination trenches comprises forming a termination insulation layer lining the sidewalls and bottom of each of the termination trenches, and forming a first conductive spacer and a second conductive spacer in each of the termination trenches, wherein the first conductive spacer and the second conductive spacer are located respectively against an inner sidewall and an outer sidewall among the termination trench sidewalls and are spaced apart from each other; forming a body region layer from the top surface of the semiconductor layer into the semiconductor layer near the top surface, wherein the body region layer has a second conductivity type opposite to the first conductivity type, and wherein the body region layer in the active area is separated into a plurality of active body regions by the plurality of gate regions, and wherein the body region layer in the termination area is separated into a plurality of floating body regions by the plurality of termination trenches; forming a guard ring region of the second conductivity type in the semiconductor layer underneath the bottom of each of the termination trenches; forming a plurality of source regions of the first conductivity type in the plurality of active body regions, wherein the source regions are located laterally adjacent to both sides of the gate regions; and forming a dielectric layer filling the space between the first spacer and the second spacer in each of the termination trenches.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," "right," "in," "out," "front," "back," "up," "down, "top," "atop", "bottom," "over," "under," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. The symbols "+" and "−" when used to describe dopants or doped regions/zones are merely used to descriptively indicate relative dopant concentration levels, but not intend to specify or limit the dopant concentration ranges, nor intend to add other limitations to the dopants and doped regions/zones. For instance, both "N+ type" and "N− type" can be referred to as "N type" in more general terms, and both "P+ type" and "P− type" can be referred to as "P type" in more general terms. Those skilled in the art should understand that the meanings of the terms identified above do not necessarily limit the terms, but merely provide illustrative examples for the terms.

Figure 3:
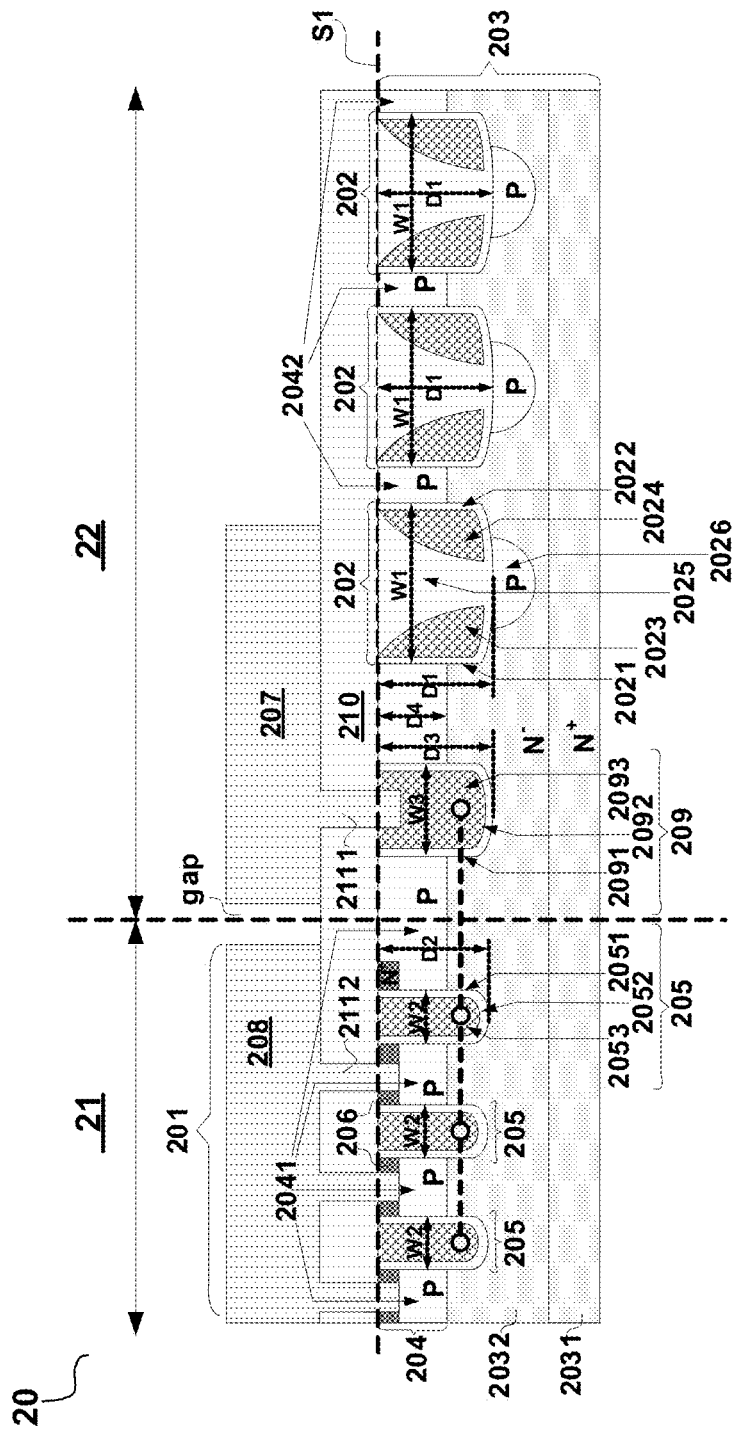
FIG. 3 illustrates schematically a cross-sectional view of a FET 20 in accordance with an embodiment of the present invention.
Figure 4:
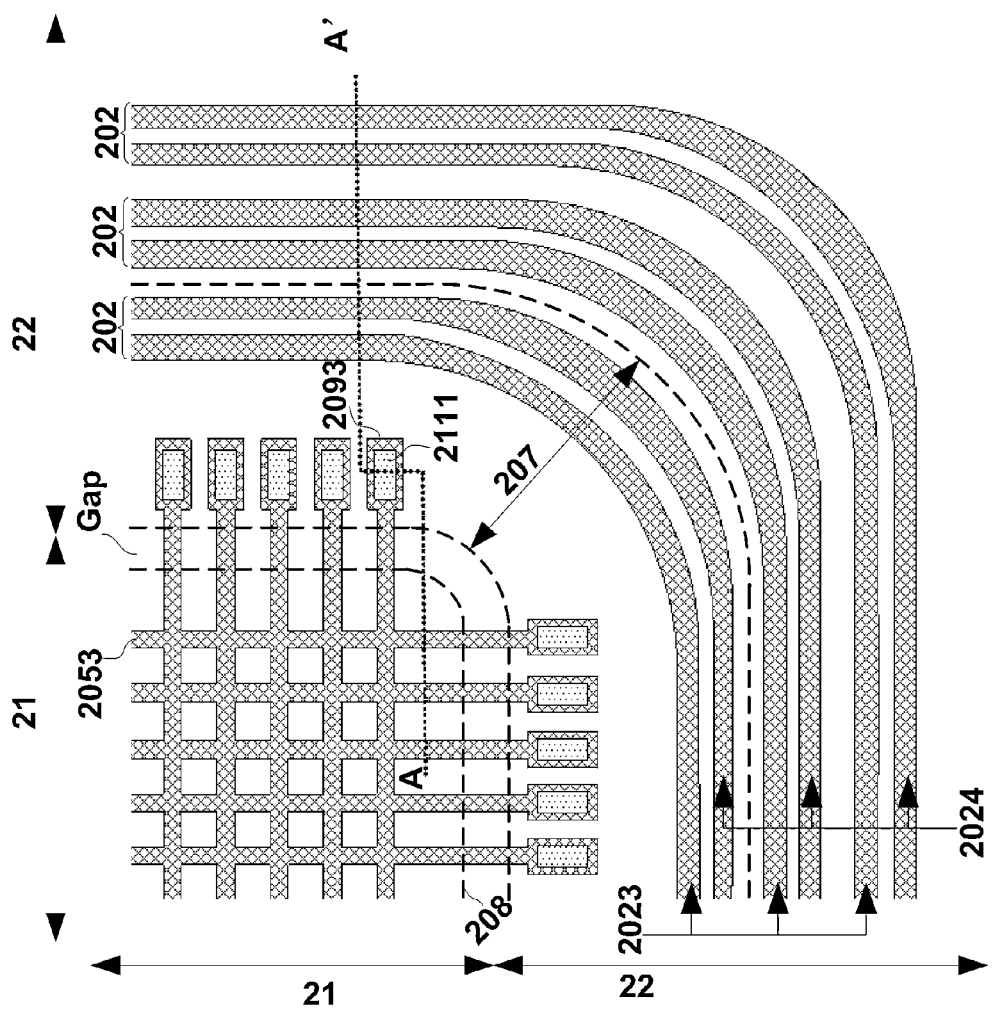
FIG. 4 illustrates schematically a top plan view of the FET 20 in accordance with an embodiment of the present invention.

FIG. 3 illustrates schematically a cross-sectional view of a FET 20 in accordance with an embodiment of the present invention. FIG. 4 illustrates schematically a top plan view of the FET 20 in accordance with an embodiment of the present invention. One having ordinary skill in the art should understand that the cross-sectional view in FIG. 3 and the top plan view in FIG. 4 illustrate actually portions of an entire die of the FET 20. For better understanding, it can be considered that the sectional view of FIG. 3 corresponds to the portion cut from the cut line AA' in the top plan view of FIG. 4. However, it should be understood that the corresponding relationship provided herein between the cross-sectional view and the top plan view of the FET 20 illustrated in FIG. 3 and FIG. 4 is not intended to be limiting.

In accordance with an exemplary embodiment of the present invention, the FET 20 is formed in a semiconductor layer 203 of a first conductivity type (e.g. illustrated as N type in FIG. 3). The substrate 203 may comprise a relatively heavy doped substrate layer 2031 (e.g. illustrated as an N+ substrate layer in FIG. 3) and a relatively light doped epitaxial layer 2032 (e.g. illustrated as an N− epitaxial layer in FIG. 3) formed on the substrate layer 2031. That is to say, the substrate layer 2031 has a larger dopant concentration than the epitaxial layer 2032. However, this is not intended to be limiting. The semiconductor layer 203 may comprise doped silicon (Si), Silicon-Germanium (SiGe), Silicon on insulator (SOI) and/or any other suitable semiconductor materials.

In accordance with an exemplary embodiment of the present invention, the semiconductor layer 203 may have an active cell area 21 and a termination area 22 located outside of the active cell area 21 (referring to the illustration in FIG. 3 and FIG. 4). It should be noted that in the embodiments illustrated in FIGS. 3 and 4, the boundaries, indicated with the vertical dotted line and double-head arrow lines, between the active cell area 21 and the termination area 22 are illustrative and approximate rather than limiting and absolute.

In accordance with an exemplary embodiment of the present invention, the FET 20 may comprise a plurality of active transistor cells 201 formed in the active cell area 21, and a plurality of termination cells 202 formed in the termination area 22. It should be noted that the term "a plurality of" herein used is not intended to be exclusively limited to "more than one", but is intended to include "one". Each active transistor cell 201 may comprise a drain region (203), a gate region 205 and a source region 206. In the exemplary embodiment shown in FIG. 3, more than one active transistor cells 201 are illustrated out, and each active transistor cell 201 is exemplarily configured to be a vertical MOSFET cell, wherein the substrate layer 2031 of the semiconductor layer 203 may function as the drain region of each active transistor cell 201, and the epitaxial layer 2032 may function as a drift region of each active transistor cell 201. The source region 206 of each active transistor cell 201 is located laterally adjacent to both sides of the gate region 205, and may have the first conductivity type with a relatively heavy dopant concentration, e.g. heavier than the dopant concentration of the epitaxial layer 2032. For instance, in FIG. 3, the source region 206 is exemplarily illustrated as an N+ type doped region, and may have a dopant concentration higher than $1\times10^{19}$ cm$^{-3}$, while the N− type doped epitaxial layer 2032 may have a dopant concentration ranges from $1\times10^{14}$ cm$^{-3}$ to $1\times10^{17}$ cm$^{-3}$. However, one of ordinary skill in the art should understand that the dopant concentration ranges provided herein are just examples and are not intended to be limiting, any suitable dopant concentrations may be chosen according to practical design, fabrication and application requirements.

In the exemplary embodiment shown in FIG. 3, the gate regions 205 for the active transistor cells 201 are illustrated as trenched gate regions. Each of the trenched gate regions 205 may comprise a gate trench 2051 opened from the top surface S1 (represented by a dotted cut line in FIG. 3) of said semiconductor layer 203. The gate trench 2051 has sidewalls and a bottom, and may include a gate insulation layer 2052 lining the gate trench sidewalls and bottom, and a gate conduction layer 2053 filling the lined gate trench (i.e. the gate trench 2051 lined with the gate insulation layer 2052). The gate conduction layer 2053 is thus isolated from the semiconductor layer 203 by the gate insulation layer 2052. The gate trench 2051 of each of the gate regions 205 may have a trench width W2 and a trench depth D2. In the example of FIG. 3, the plurality of trenched gate regions 205 illustrated in sectional view are actually electrically connected with each other by transverse segments (illustrated in FIG. 3 by dotted line) of the trenched gate regions 205 having the same structure as those shown in the sectional view. Further referring to the top plan view of FIG. 4, the electrical connection of the trenched gate regions 205 may be better understood. It should be noted that in the top plan view of FIG. 4, only the gate conduction layer 2053 of the gate regions 205 is illustrated out for clarity and simplicity.

It should be noted that, in the present disclosure, the term "laterally" refers to a direction parallel to the cut line S1 of the top surface of the semiconductor layer 203. The term "width" refers to a distance measured laterally. The term "vertically" refers to a direction perpendicular to the top surface of the semiconductor layer 203. The term "depth" refers to a distance measured vertically.

In accordance with an exemplary embodiment of the present invention, the plurality of termination cells 202 are disposed in the semiconductor layer 203 in the termination area 22, and are arranged substantially in parallel from an inner side (close to the active cell area 21) toward an outer side (far away from the active cell area 21) of the termination area 22. In the example of FIG. 3, more than one (e.g. three) termination cells 202 are illustrated out. Each of the termination cells 202 may comprise a termination trench 2021 opened from the top surface S1 (represented by a dotted cut line in FIG. 3) of said semiconductor layer 203. The termination trench 2021 has sidewalls and a bottom. The termination trench 2021 may include a termination insulation layer 2022 lining the termination trench sidewalls and bottom. The termination trench 2021 lined with the termination insulation layer 2022 may further include a first conductive spacer 2023 and a second conductive spacer 2024 located respectively against an inner sidewall (e.g. the left sidewall of each termination trench 2021 in the cross-sectional view illustrated in FIG. 3) and an outer sidewall (e.g. the right sidewall of each termination trench 2021 in the cross-sectional view illustrated in FIG. 3) among the termination trench sidewalls of the termination trench 2021, wherein the first conductive spacer 2023 and the second conductive spacer 2024 are spaced apart from each other with a space. The termination trench 2021 may further include a dielectric layer 2025 filling the space between the first conductive spacer 2023 and the second conductive spacer 2024. The termination trench 2021 of each of the termination cells 202 may have a trench width W1 and a trench depth D1. The trench width W1 of each termination trench 2021 is greater than the trench width W2 of each gate trench 2051. The trench depth D1 of each termination trench 2021 may be the same as or different from the trench depth D2 of the gate trenches 205. The terms "inner" and "outer" herein used can respectively be considered as "closer" and "further" to the active cell area 21 in location. The arrangement of the termination cells 202 may be better understood when read in conjunction with the top plan view illustrated in FIG. 4. It should be noted that the conductive spacers 2023 and 2024 are illustrated out in FIG. 4 while other elements of the termination cells 202 are omitted for clarity and simplicity.

Each of the termination cells 202 may further comprise a guard ring region 2026 of a second conductivity type (e.g. illustrated as P type in FIG. 3) formed in the semiconductor layer 203 (e.g. in the epitaxial layer 2023 in FIG. 3) and located underneath the bottom of a corresponding termination trench 2021. The second conductivity type is opposite to the first conductivity type. As shown in the example of FIG. 3, in each of the termination cells 202, the guard ring region 2026 contacts the bottom of the corresponding termination trench 2021.

In accordance with an exemplary embodiment of the present invention, still referring to FIG. 3, the FET 20 may further comprise a body region 204 formed in the semiconductor layer 203 and near the top surface S1 of the semiconductor layer 203. The body region 204 has the second conductivity type and is illustrated as a P type doped region in the example of FIG. 3. The body region 204 has a body depth D4 from the top surface S1 into the epitaxial layer 2032. In an exemplary embodiment, the body depth D4 is smaller/shallower than both of the trench depth D1 of the termination trenches 2021 and the trench depth D2 of the gate trenches 2051. The body region 204 is thus separated by the plurality of trenched gate regions 205 into a plurality of active body regions 2041 located in the active cell area 21 and is further separated by the plurality of termination trenches 2021 into a plurality of floating body regions 2042 located in the termination area 22. Therefore, in this exemplary embodiment as illustrated in FIG. 3, for each of the active transistor cells 201 in the active cell area 21, the source region 206 is formed in a corresponding active body region 2042 near the top surface S1. In the termination area 22, the plurality of termination cells 202 are disposed interleaving with the plurality of floating body regions 2042. The body region 204 (including the active body regions 2041 and the floating body regions 2042) is relatively lightly doped compared to the source regions 206.

In accordance with an exemplary embodiment of the present invention, the FET 20 may further comprise a source electrode 208, a gate electrode 207 and a drain electrode (not shown in FIG. 3). In the embodiment shown in FIG. 3, the source electrode 208 is exemplarily illustrated as to comprise a source metal 208 formed above the active cell area 21. The gate electrode 207 is exemplarily illustrated as to comprise a source metal 207 formed above the termination area 22. In an embodiment, the gate metal 207 is substantially surrounding the outside of the source metal 208 and is separated from the source metal 208 with a gap. For better understanding, the source metal 208 and gate metal 207 are also illustrated out in the top plan view illustration of FIG. 4 with their outlines represented by dotted lines. In an embodiment, the active body regions 2041 and the source regions 206 of the active transistor cells 201 are electrically coupled to the source electrode (e.g. the source metal 208 illustrated in FIG. 3) of the FET 20. The gate regions 205 are electrically coupled to the gate electrode (e.g. the gate metal 207 illustrated in FIG. 3). The floating body regions 2042 are not intended to couple any established potentials (e.g. the floating body regions 2042 are not coupled to any of the source electrode/source metal 208, gate electrode/gate metal 207 and drain electrode of the FET 20), but are electrically floating and have a floating potential.

In accordance with an exemplary embodiment of the present invention, the FET 20 may further comprise at least one gate runner 209 disposed in the termination area 22 of the semiconductor layer 203. In the example of FIG. 3, the gate runner 209 is located more inner than the innermost termination cell 202 among the plurality of termination cells 202. That is to say, the gate runner 209 is closer to the active cell area 21 or the active transistor cells 201 than the innermost termination cell 202. The gate runner 209 is provided to facilitate the implementation of electrical coupling/connection of the gate regions 205 to the gate electrode/gate metal 207. In one embodiment, the gate runner 209 comprises a runner trench 2091 opened from the top surface S1 of said semiconductor layer 203. The runner trench 2091 has sidewalls and a bottom, and includes a runner insulation layer 2092 lining the runner trench sidewalls and bottom. The runner trench 2091 further includes a runner conduction layer 2093 filling the lined runner trench (i.e. the runner trench 2091 lined with the runner insulation layer 2092). The runner conduction layer 2093 is thus isolated from the semiconductor layer 203 and the body region 204 (i.e. the active body region 2041) by the runner insulation layer 2092. In accordance with an exemplary embodiment of the present invention, the gate regions 205 are electrically coupled to the at least one gate runner 209. For instance, in the example illustrated in FIG. 3 where the gate regions 205 are configured as trenched gate regions, the gate trenches 2051 are connected to the runner trench 2091 by a transverse segment (illustrated in FIG. 3 by dotted line) of either the gate trenches 2051 or the gate runner trench 2091 such that the gate conduction layer 2053 of the trenched gate regions 205 is connected to the runner conduction layer 2093. That is to say, the at least one runner trench 2091 is formed to intersect with the gate trenches 2051. The runner conduction layer 2093 is electrically coupled to the gate electrode/gate metal 207 so that the trenched gate regions 205 (the gate conduction layer 2053 of these gate regions) are electrically coupled to the gate electrode/gate metal 207, and thus can receive electrical signals provided to the gate electrode 207. In one embodiment, the runner trench 2091 may have a trench width W3 and a trench depth D3, wherein the runner trench width W3 is greater than the trench width W2 of the gate trenches 2051. Therefore, the runner conduction layer 2093 can provide larger contactable area for forming connection(s) (e.g. the via 2111 illustrated in FIG. 3) to the gate electrode 207 and thus facilitate the electrical coupling of the gate regions 205 to the gate electrode 207. This can be better understood when read in conjunction with the top plan view illustrated in FIG. 4. It should be noted that in the top plan view of FIG. 4, the gate conduction layer 2053, the runner conduction layer 2093 and the via 2111 are illustrated out while other elements of the gate structures (e.g. the gate structures may refer to the gate regions 205, the at least one gate runner 209 and the gate metal 207) are omitted for clarity and simplicity. In the example of FIG. 4, more than one gate runners 209 are illustrated. One having ordinary skill in the art should understand that the structures and connections of the gate regions 205 and the trenched gate runner 209 shown in FIGS. 3 and 4 are only for purpose of illustration. Actually, the structures, arrangements, and connection relationships of the gate regions 205 and the gate runners 209 are not limited to that described above with reference to FIGS. 3 and 4.

In accordance with an exemplary embodiment of the present invention, the trench width D1 of each of the termination trenches 2021 is further greater than the trench width W3 of the runner trench 2091 to facilitate formation of the spacers 2023 and 2024, and to enable adjustion of the space size between the spacers 2023 and 2024, thereby enabling adjustment of the second-conductivity-type guard ring region 2026 which may be formed through second-conductivity-type dopant implantation into the semiconductor layer 203 (e.g. into the epitaxial layer 2032 in the example of FIG. 3) via the space between the two spacers. Although in the example of FIG. 3, the trench depth D1 of the termination trench 2021, the trench depth D2 of the gate trench 2051 and the trench depth of the runner trench 2091 are illustrated to be substantially the same, in other embodiment the depth D1, D2 and D3 may not match with each other. In accordance with an exemplary embodiment of the present invention, the gate insulation layer 2052, the runner insulation layer 2092 and the termination insulation layer 2022 may comprise a same dielectric material such as silicon dioxide. In other embodiments, the gate insulation layer 2052, the runner insulation layer 2092 and the termination insulation layer 2022 may comprise different dielectric materials. The gate conduction layer 2053, the runner conduction layer 2093 and the first and second conductive spacers 2023 and 2024 may comprise a same conduction material such as doped polysilicon. In other embodiments, the gate conduction layer 2053, the runner conduction layer 2093 and the first and second conductive spacers 2023 and 2024 may comprise different conduction materials other than polysilicon that are compatible with other aspects of the device manufacturing process. Thus, the term "poly-silicon" is intended to include such other conductive or semi-conductive materials and combinations thereof in addition to silicon.

In accordance with an exemplary embodiment of the present invention, the FET 20 may further comprise an interlayer dielectric ("ILD") layer 210 that is disposed between the metal layer (e.g. including the source metal 208 and gate metal 207) and the semiconductor layer 203 to prevent the source metal 208 being undesirably shorted to the gate regions 205 and/or the gate metal 207 being undesirably shorted to the source regions 206. In one embodiment, the termination dielectric layer 2025 in each of the termination trenches 2021 may comprise a same dielectric material as the ILD layer 210. In accordance with an embodiment of the present invention, the gate metal 207 is electrically coupled to the at least one gate runner 209 through a first plurality of vias 2111 formed in the ILD layer 210, e.g. the gate metal 207 extends through the vias 2111 to contact the runner conduction layer 2093 of the gate runner 209 so that the gate metal 207 is coupled to the gate regions 205 through the gate runner 209. Similarly, the source metal 208 is electrically coupled to the source regions 206 through a second plurality of vias 2112 formed in the ILD layer 210, e.g. the source metal 208 extends through the vias 2112 to contact the source regions 206 and the active body regions 2041. One having ordinary skill in the art should understand that the term "plurality of" herein is not exclusively limited to more than one, but is intended to include one. In one embodiment, the gate metal 207 also extends laterally to overlay a substantial portion of the innermost termination trench 2021 of the innermost termination cell 202. In one embodiment, the FET 20 may further comprise a drain electrode such as a drain metal (not shown in FIG. 3) formed directly at the bottom surface of the semiconductor layer 203 and electrically contacts with the substrate layer (the drain region) 2031.

Figure 1:
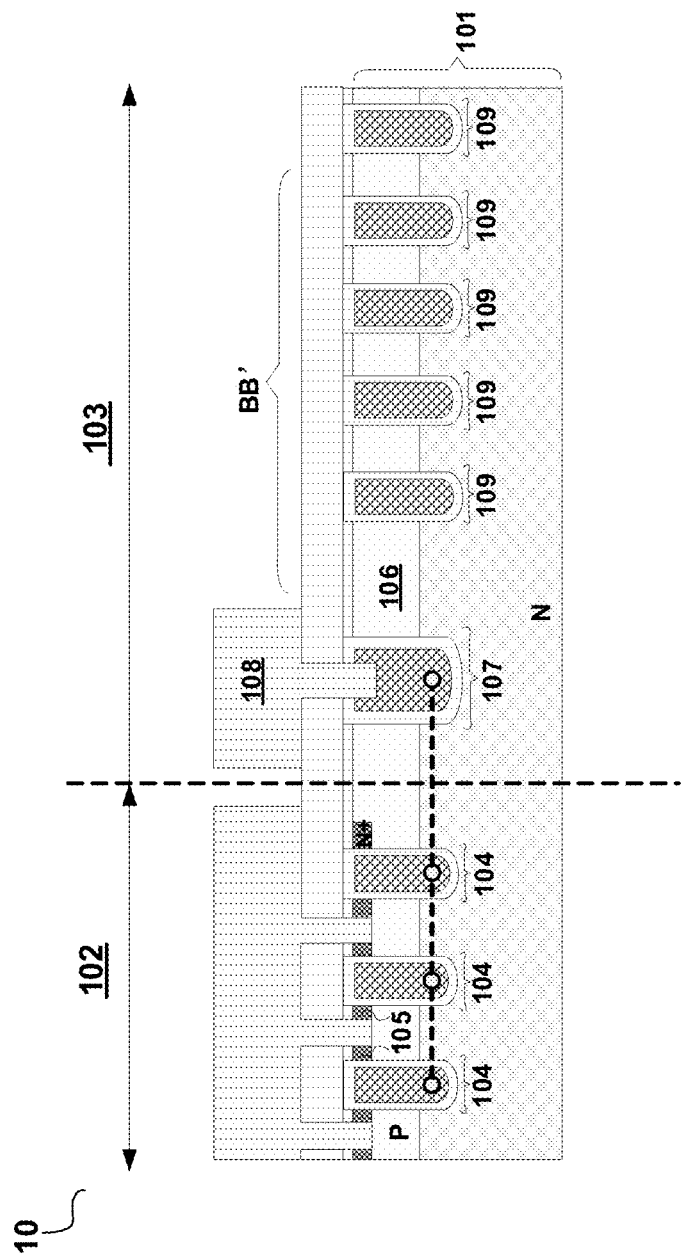
FIG. 1 illustrates schematically a cross-sectional view of an existing trench gate FET 10 having trenched termination cells.
Figure 2:
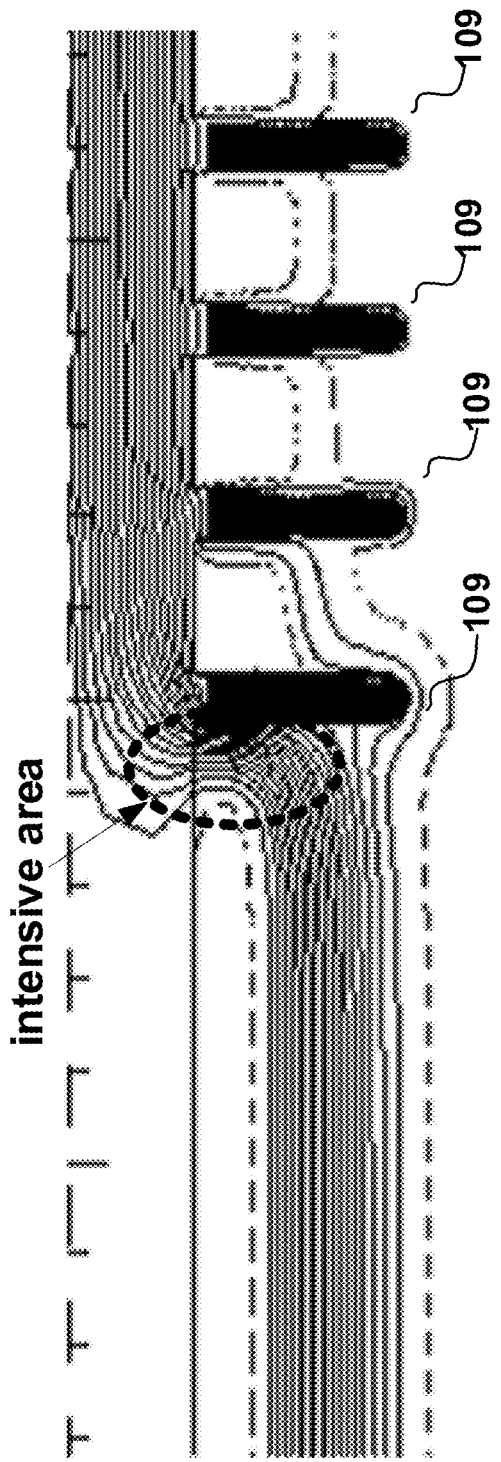
FIG. 2 illustrates a simulated equal potential line distribution diagram of a portion of the trenched termination cells 109 in the FET 10.
Figure 5:
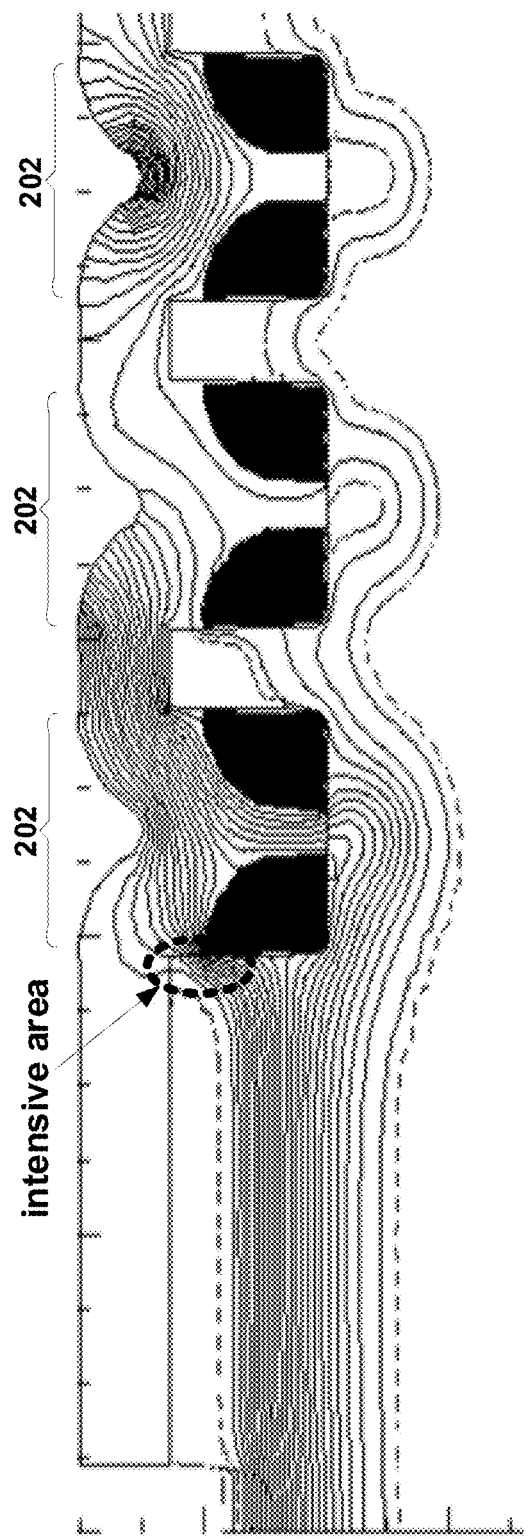
FIG. 5 illustrates a simulated equal potential line distribution diagram of a portion of the termination cells 202 in the FET 20.

In accordance with the various embodiments of the present invention described above with reference to FIGS. 3 and 4, the termination cells 202 of the FET 20 can help to block undesired electrical current/carries leakage path from the termination area 22 to the active cell area 21, thereby shielding the active transistor cells 201 from being affected by the undesired carries. For each of the termination cells 202, the termination trench 2021 is lined with the termination insulation layer 2022 and filled with the first conductive spacer 2023, the second conductive spacer 2024 and the dielectric layer 2025. The termination insulation layer 2022 may have a relatively thin thickness, e.g. as thin as that of the gate insulation layer 2052 and/or the runner insulation layer 2092. The termination dielectric layer 2025 may have a thickness relatively thicker than that of the termination insulation layer 2022. The thickness of the termination dielectric layer 2025 can be adjusted by modifying a size of the space between the two conductive spacers 2023 and 2024 and/or the trench width W1 of the termination trenches 2021. In comparison with a FET having only guard rings as termination cells as mentioned in the background section, the FET 20 may have a smaller termination area and may be cost saving for manufacturing because at least one mask layer for guard ring region implantation can be saved, since the guard ring regions 2026 of FET 20 may be implanted with the shield of the spacers 2023 and 2024. Compared with the FET 10 of FIG. 1, when the FET 20 is off and a high drain to source voltage (e.g. 30V) is applied between the drain region 2031 and the source region 206, the high drain to source voltage drops among the relatively thin termination insulation layer 2022 and the relatively thick dielectric layer 2025 between the spacers 2023 and 2024 for each of the termination cells 202. Therefore, the termination insulation layer 2022 of FET 20 suffers a lower electric field intensity/a lower voltage than the thin oxide layer lining the sidewalls of the trenched termination cells 109 of FET 10, under a same doping condition and a same required breakdown voltage. The second-conductivity-type guard ring region 2026 under the bottom of the termination trench 2021 in each of the termination cells 202 may beneficially further reduce the electric field intensity near the sidewalls and bottom of each of the termination trenches 2021. FIG. 5 illustrates a simulated equal potential line distribution diagram of a portion of the termination cells 202 (e.g. a portion corresponding to the BB' area in FIG. 3) in the FET 20 shown in FIG. 3 when the FET 20 is OFF and a high drain to source voltage (e.g. 30V) is applied between the drain region 2031 and the source region 206. It can be seen from FIG. 5 that the intensity of the equal potential lines near the left side (e.g. the portion looped by the dotted ellipse) of the innermost termination trench 2021 of the innermost termination cell 202 are reduced in comparison with those near the left side of the innermost trenched termination cell 109 shown in FIG. 2. Thus, the electric field intensity near the left side of the innermost termination trench 2021 is suppressed, decreasing the possibility of the termination insulation layer 2022 being punched through. In the meanwhile, the breakdown voltage of FET 20 may be improved and walk-out/deviation in the breakdown voltage may be eliminated or at least suppressed. The ruggedness and lifetime of the FET 20 are consequently improved.

Figure 6:
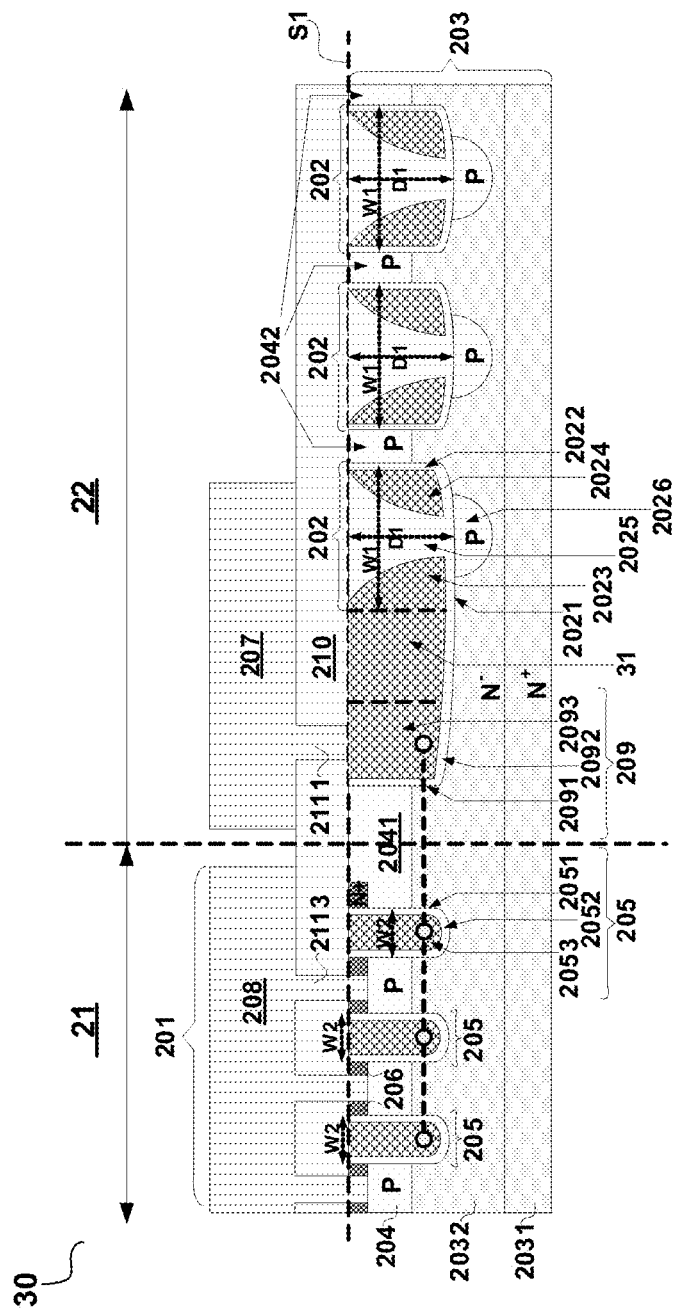
FIG. 6 illustrates schematically a cross-sectional view of a FET 30 in accordance with an embodiment of the present invention.
Figure 7:
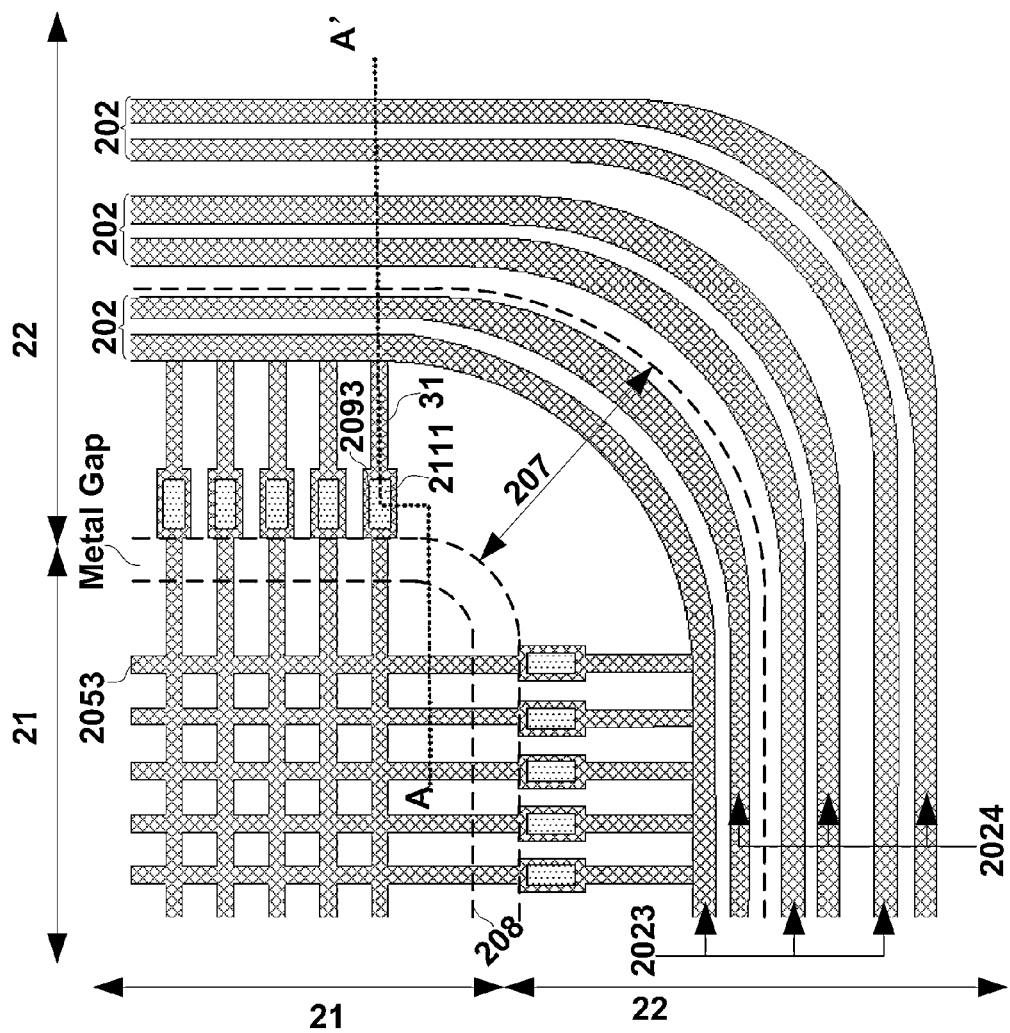
FIG. 7 illustrates schematically a top plan view of the FET 30 in accordance with an embodiment of the present invention.

FIG. 6 illustrates schematically a cross-sectional view of a FET 30 in accordance with an embodiment of the present invention. Components or structures in the FET 30 with substantially the same functions as those of the FET 20 are identified by the same reference labels for the sake of simplicity. In the exemplary embodiment of FIG. 6, the runner trench 2091 is connected to the innermost termination trench 2021 of the innermost termination cell 202 among the plurality of termination cells 202 and the runner conduction layer 2093 is electrically connected to the first conductive spacer 2023 of the innermost termination trench 2021. In an embodiment, the runner trench 2091 may be connected to the innermost termination trench 2021 via a transverse segment 31 having the same structure as the gate trench 2051 or the runner trench 2091. FIG. 7 illustrates schematically a top plan view of the FET 30 in accordance with an embodiment of the present invention. One having ordinary skill in the art should understand that the cross-sectional view in FIG. 6 and the top plan view in FIG. 7 illustrate actually portions of an entire die of the FET 30. For better understanding, it can be considered that the sectional view of FIG. 6 corresponds to the portion cut from the cut line AA' in the top plan view of FIG. 7. However, it should be understood that the corresponding relationship provided herein between the cross-sectional view and the top plan view of the FET 30 illustrated in FIG. 6 and FIG. 7 is not intended to be limiting. Similar as in the top plan view of FIG. 4, in the example of FIG. 7, only the conduction layers 2053 and 2093, the segment 31 connecting the runner conduction layer 2093 to the innermost first conductive spacer 2023 and the first and second conductive spacers 2023 and 2024 are illustrated out for clarity and simplicity.

In the exemplary embodiments illustrated in FIGS. 6 and 7, the innermost termination trench 2021 is electrically coupled to the gate regions 205 since the first conductive spacer in the innermost termination trench 2021 is electrically connected to the runner conduction layer 2093. In practical application, when the FET 30 is off and reverse biased with a drain to source voltage applied between the drain region 2031 and the source regions 206, the gate regions 205 are substantially grounded to a reference ground potential. Therefore, the innermost termination trench 2021 is no longer floating but substantially grounded in this circumstance, which further reduces the electric field intensity near the sidewalls and bottom of each termination trench 2021. Thus, the possibility of the termination insulation layer 2022 being punched through is further reduced. In the meanwhile, the breakdown voltage of FET 30 may be increased and walk-out/deviation in the breakdown voltage may be eliminated or at least suppressed. The ruggedness and lifetime of the FET 30 are further improved.

Although the present disclosure takes the example of an N-channel FET (such as FET 20 or FET 30) comprising an N-channel trenched gate vertical MOSFET (such as MOSFET 201) and a termination structure (e.g. including the gate runner 209 and the termination cells 202) to illustrate and explain the structures of a FET having a termination structure according to various embodiments of the present invention, this is not intended to be limiting. Persons of skill in the art will understand that the structures and principles taught herein also apply to other types of semiconductor materials and devices as well, for example, the FETs 20 and 30 may be P-channel FETs. In other alternative embodiments, the MOSFET 201 may be a DMOS transistor or a JFET etc. The MOSFET 201 is not limited to vertical transistor and trenched gate transistor described, but can be a lateral transistor or a planar gate transistor instead.

The advantages of the various embodiments of the FET (e.g. 20 or 30) having the termination structure (e.g. 209 and 202) of the present invention are not confined to those described above. These and other advantages of the various embodiments of the present invention will become more apparent upon reading the whole detailed descriptions and studying the various figures of the drawings.

FIGS. 8A through 8G are cross-sectional views illustrating schematically a sequential process of a method for forming a FET (e.g. the FET 20) having a termination structure (e.g. the termination structure including the termination cells 202) in accordance with an exemplary embodiment of the present invention.

Figure 8A:
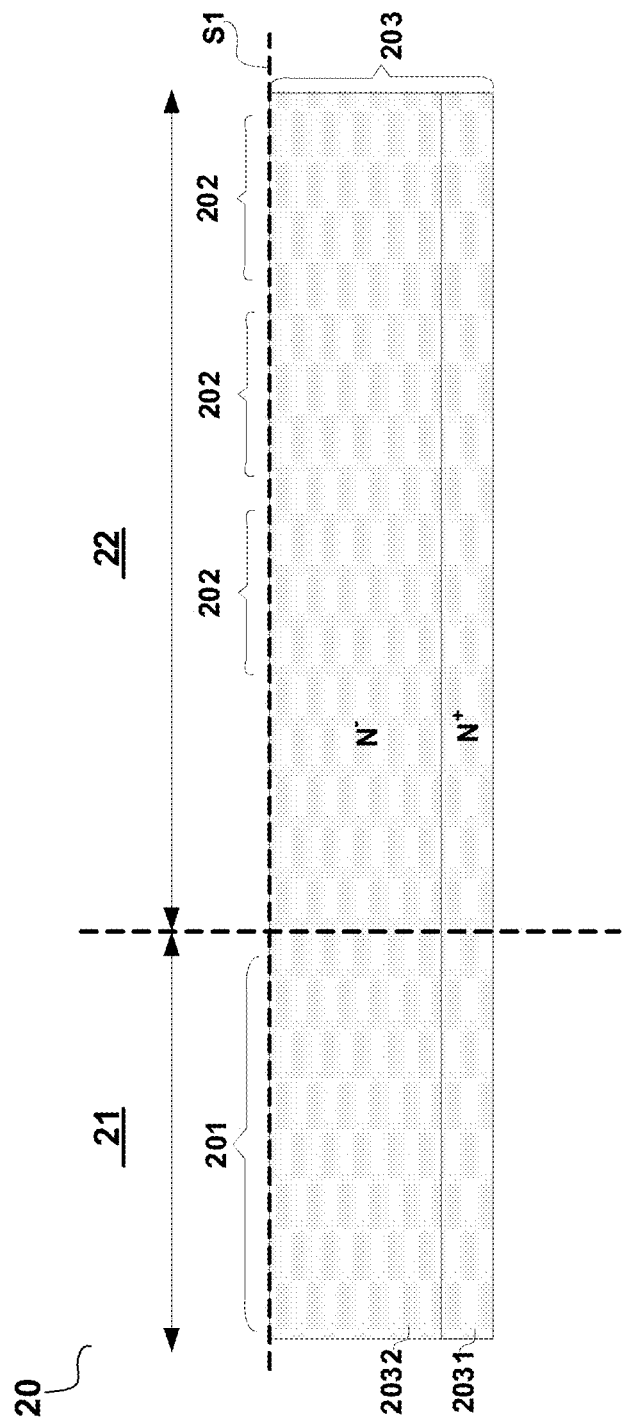
FIGS. 8A through 8G are cross-sectional views illustrating schematically a sequential process of a method for forming a FET having a termination structure in accordance with an exemplary embodiment of the present invention.

Referring to FIG. 8A, an initial semiconductor layer 203 having a first conductivity type (e.g. illustrated as N type in FIG. 8A) is provided. The semiconductor layer 203 may comprise a relatively heavy doped substrate layer 2031 (e.g. illustrated as an $N^+$ substrate layer in FIG. 8A) and a relatively light doped epitaxial layer 2032 (e.g. illustrated as an $N^-$ epitaxial layer in FIG. 8A) formed on the substrate layer 2031. The semiconductor layer 203 may be divided into an active cell area 21 and a termination area 22 (also referring to the top plan view illustration in FIG. 4 and FIG. 7) that are respectively designated for forming active transistor cells 201 of the FET 20 and termination cells 202 of the termination structure. It should be understood that the cross sectional views in FIGS. 8A-8G illustrate only portions of the FET 20. For instance, the sectional view in each of these figures can be considered as corresponding to the portion cut from the cut line AA' in the top plan view of FIG. 4 for better understanding.

Subsequently, referring to FIG. 8B, a plurality of gate trenches 2051 are formed in the active cell area 21 for forming gate regions 205 of the active transistor cells 201. In accordance with an exemplary embodiment of the present invention, at least one gate runner trench 2091 for a gate runner 209 and a plurality of termination trenches 2021 for a plurality of termination cells 202 are formed in the termination area 22 at the same time when the gate trenches 2051 are formed to save manufacturing steps and costs. However, this is not intended to be limiting, one of ordinary skill in the art should understand that the gate trenches 2051, runner trench 2091 and termination trenches 2021 may not be formed at the same time/in the same step in other embodiments. In one embodiment, each of the termination trenches 2021 may have a trench width W1 and a trench depth D1, each of the gate trenches 2051 may have a trench width W2 and a trench depth D2 and the runner trench 2091 may have a trench width W3 and a trench depth D3. In one embodiment, the trench width W3 of the runner trench 2091 is greater than that (W2) of the gate trenches 2051, i.e.

W3>W2. In one embodiment, the trench width W1 of the termination trenches 2021 may be greater than that (W2) of the gate trenches 2051 and further greater than that (W3) of the runner trench 2091, i.e. W1>W3 and W1>W2. In one embodiment, the termination trenches 2021, the gate trenches 2051, and the runner trench 2091 may share a substantially same trench depth as illustrated in the example of FIG. 8B, i.e. D1≈D2≈D3. In other embodiment, the depths D1, D2 and D3 may not match with each other.

Subsequently, referring to FIG. 8C, a gate insulation layer 2052 (e.g. silicon dioxide) lining the sidewalls and bottom of the gate trenches 2051 is formed (e.g. through thermal oxidation). In accordance with an exemplary embodiment of the present invention, a runner insulation layer 2092 lining the sidewalls and bottom of the at least one gate runner trench 2091 and a termination insulation layer 2022 lining the sidewalls and bottom of the termination trenches 2021 are also formed at the same time when the gate insulation layer 2052 is formed to save manufacturing steps and costs. In this case, the gate insulation layer 2052, the runner insulation layer 2092 and the termination insulation layer 2022 may comprise a same insulation material. However, this is not intended to be limiting, one of ordinary skill in the art should understand that the gate insulation layer 2052, runner insulation layer 2092 and termination insulation layer 2022 may not be formed at the same time/in the same step in other embodiments. In the following, still referring to FIG. 8C, a conduction layer such as a doped polysilicon layer is formed (e.g. through polysilicon deposition) in the lined gate trenches 2051 and on the top surface S1 of the semiconductor layer 203 till the conduction layer exceeds the top surface S1 with a designed thickness so as to fully fill the lined gate trenches 2051. In accordance with an embodiment of the present invention, for saving manufacturing steps and costs, the conduction layer is also formed in the lined at least one runner trench 2091 and the lined termination trenches 2021 so that the runner trench 2091 is fully filled while the termination trenches 2021 are partially filled (e.g. there remains an unfilled portion in each of the termination trenches 2021 as illustrated in FIG. 8C). The termination trenches 2021 are partially filled because they have greater trench width (W1) than the gate trenches 2051 and the runner trench 2091.

Subsequently, referring to FIG. 8D, an extra portion of the conduction layer above the top surface S1 of the semiconductor layer 203 is removed (e.g. through polysilicon etch back) so that the top surface S1 of the semiconductor layer 203 is flattened and exposed, and each of the gate trenches 2051 is filled with an individual gate conduction layer 2053, and the runner trench is filled with an individual runner conduction layer 2093. In the meanwhile, a middle portion of the conduction layer in each of the termination trenches 2021 is also removed, leaving a first conductive spacer 2023 and a second conductive spacer 2024 respectively against an inner sidewall (e.g. the left sidewall of each termination trench 2021 in the cross-sectional view illustrated in FIG. 8D) and an outer sidewall (e.g. the right sidewall of each termination trench 2021 in the cross-sectional view illustrated in FIG. 8D) of each of the termination trenches 2021, and exposing a middle portion of the bottom to each of the termination trenches 2021. The first conductive spacer 2023 and the second conductive spacer 2024 are thus spaced apart with each other by a space between them. In the exemplary embodiment shown, after the step in FIG. 8D, formation of the plurality of gate regions 205 and the at least gate runner 209 are substantially completed. The plurality of trenched gate regions 205 illustrated in the sectional view are actually electrically connected with each other by transverse segments (illustrated in FIG. 8D by dotted line) of the trenched gate regions 205 having the same structure and formed with the same steps as those shown in the sectional view. In accordance with an exemplary embodiment of the present invention, a trenched transverse connection (which is intended to include "a plurality of trenched transverse connections") connecting the gate trenches 2051 to the runner trench 209 is also formed with the same steps as for forming the gate regions 205 or the gate runner 209. The trenched transverse connection may include transverse segment (illustrated in FIG. 8D by dotted line) of either the gate trenches 2051 or the runner trench 2091 such that the gate conduction layer 2053 are connected to the runner conduction layer 2093.

Subsequently, referring to FIG. 8E, for each of the termination cells 202, a doped guard ring region 2026 of a second conductivity type (e.g. illustrated as P type in FIG. 8E) is formed in the semiconductor layer 203 (e.g. in the epitaxial layer 2023 in FIG. 8E) underneath the bottom of each of the termination trenches 2021. To provide an example, the guard ring region 2026 underneath each of the termination trenches 2021 may be formed by implanting second-conductivity-type (e.g. P type in FIG. 8E) dopants into the semiconductor layer 203 through the exposed middle portion of the bottom to each of the termination trenches 2021 (i.e. through the space between the spacers 2023 and 2024 in each of the termination trenches 2021). In accordance with an exemplary embodiment of the present invention, still referring to FIG. 8E, a body region 204 of the second conductivity type (e.g. P type in FIG. 8E) may be formed from the top surface S1 into the semiconductor layer 203 with a depth D4 in the same step for forming the guard ring regions 2026. The depth D4 of the body region 204 is smaller/shallower than that (D1) of the termination trenches 2021, that (D2) of the gate trenches 2051 and that (D3) of the runner trench 2091, i.e. D4<D1, D4<D2 and D4<D3. The gate trenches 2051 separate the body region 204 in the active cell area 21 into a plurality of active body regions 2041, and the termination trenches 2021 separate the body region 204 in the termination area 22 into a plurality of floating body regions 2042. According to this exemplary embodiment, the second-conductivity-type dopant implantation for forming the guard ring regions 2026 and the body region 204 (the active body regions 2041 and the floating body regions 2042) can be proceeded without applying an extra mask. Therefore, this is cost saving.

Subsequently, referring to FIG. 8F, a plurality of source regions 206 of the first conductivity type (e.g. N type in FIG. 8F) for the active transistor cells 201 are formed in the active body regions 2041 of the active cell area 21. The source regions 206 are formed near the plurality of gate regions 205 and are located laterally on both sides of the gate regions 205. To provide an example, the source regions 206 may be formed through first-conductivity-type dopant implantation from the top surface S1 into the active body regions 2041 with the shield of a patterned source mask layer (not shown in FIG. 8F for simplicity).

Subsequently, referring to FIG. 8G, a termination dielectric layer 2025 is formed in each of the termination trenches 2021 to fill the space between the spacers 2023 and 2024. In the following, an ILD layer 210 is formed atop the top surface S1 to overlie the entire top surface S1 of the partially processed device. In one embodiment, the ILD layer 210 and the termination dielectric layer 2025 may comprise a same dielectric material such as silicon dioxide and may be formed in a same step for saving manufacturing steps and costs. Subsequently, still referring to FIG. 8G, a first plurality of vias 2111 and a second plurality of vias 2112 are formed in the ILD layer 210. The first plurality of vias 2111 are located in portions of the ILD layer 210 which are directly over the source regions 206. The second plurality of vias 2112 are located portions of the ILD layer 210 which portion are directly over the gate runner 209. In the following, a gate metal 207 and a source metal 208 are formed respectively over the termination area 22 and the active cell area 21 atop the ILD layer 210, wherein the gate metal 207 and the source metal 208 are separated with a gap. The gate metal 207 is electrically coupled to the gate runner 209 and thus to the gate regions 205 through the first plurality of vias 2111, the source metal 208 is electrically coupled to the source regions 206 through the second plurality of vias 2112. In one embodiment, the gate metal 207 is formed to extend laterally to overlay a substantial portion of the innermost termination trench 2021 of the innermost termination cell 202.

Figure 8B:
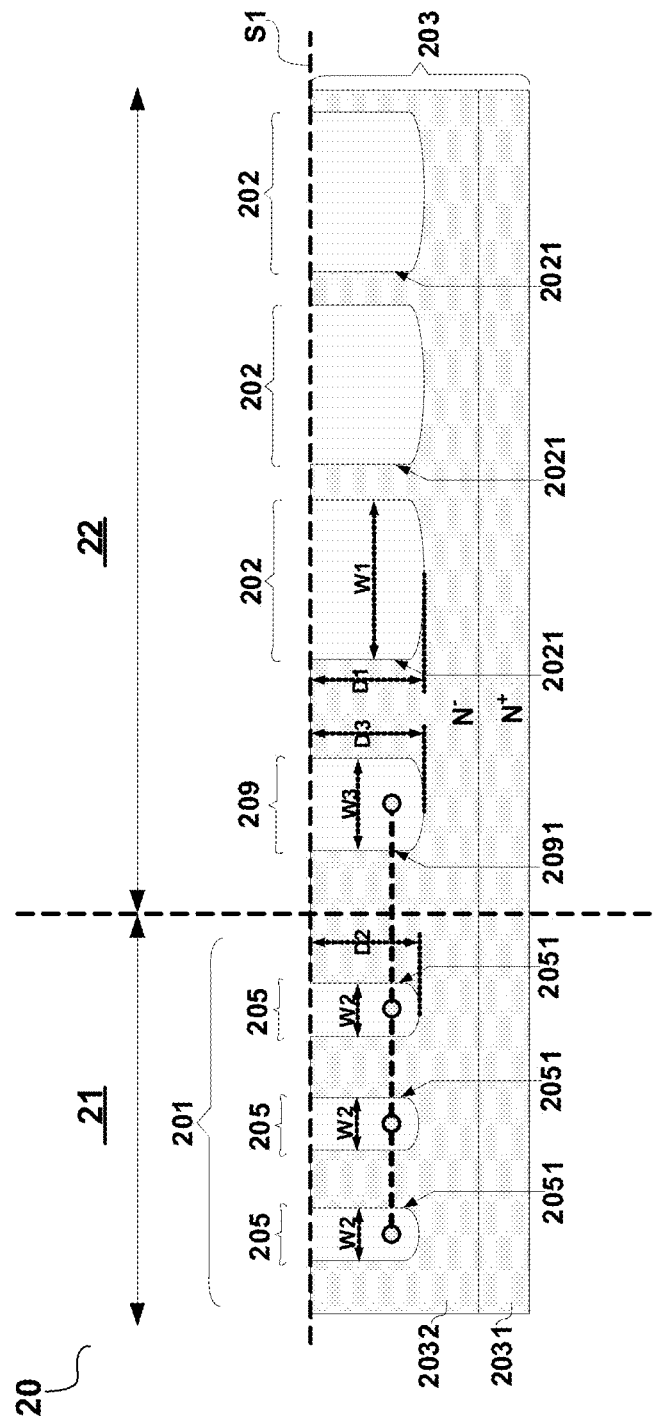
Figure 8C:
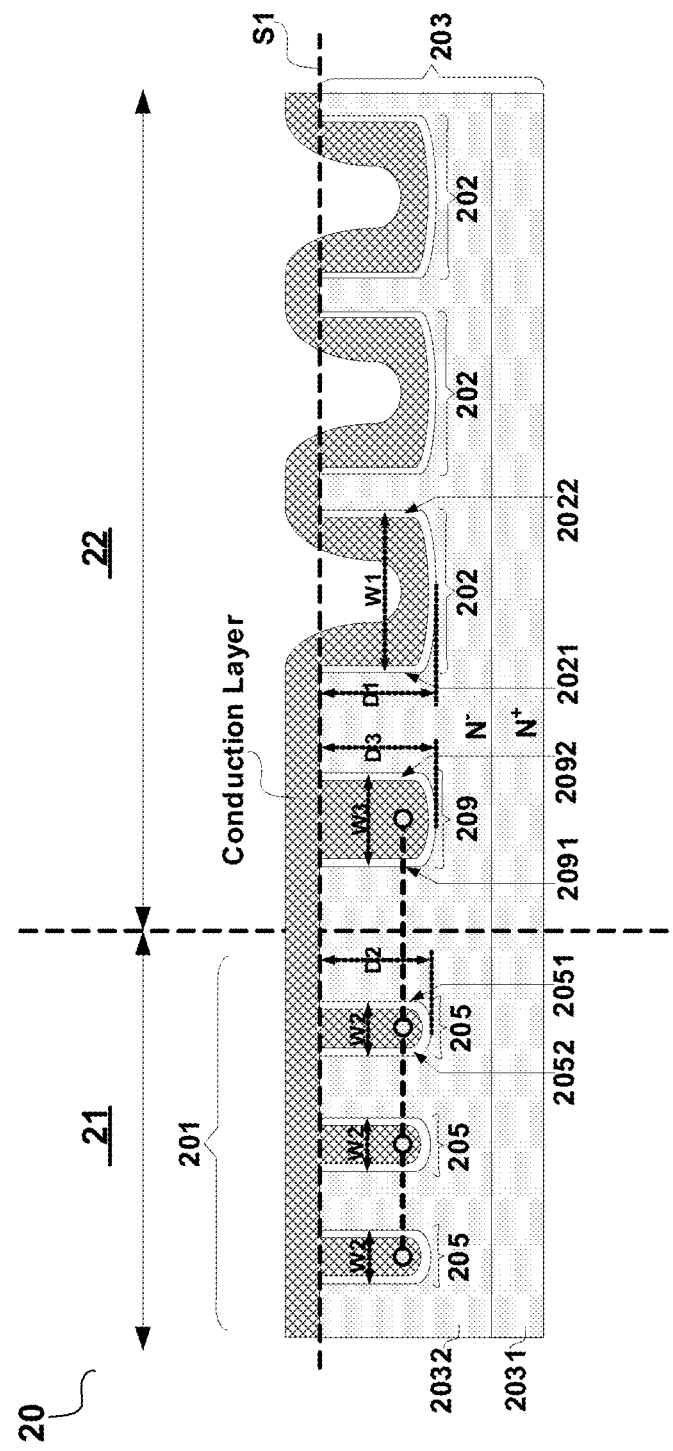
Figure 8D:
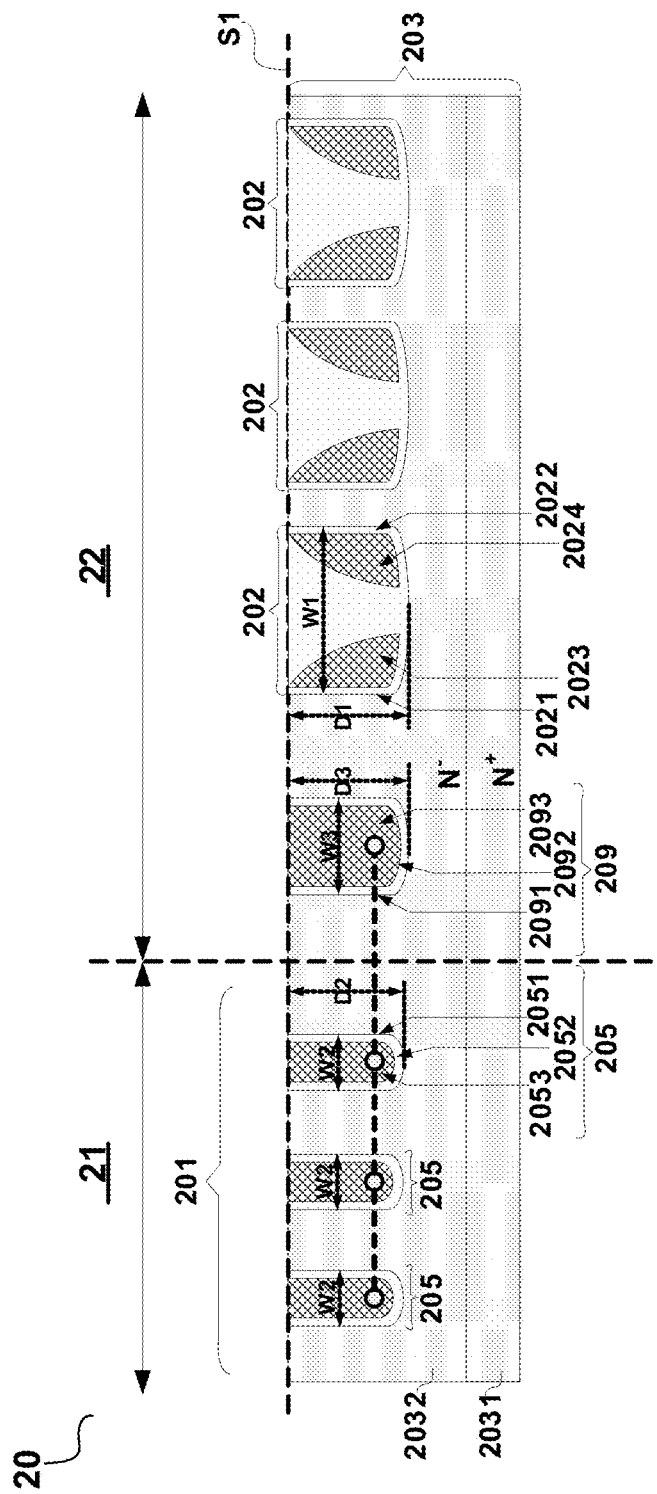
Figure 8E:
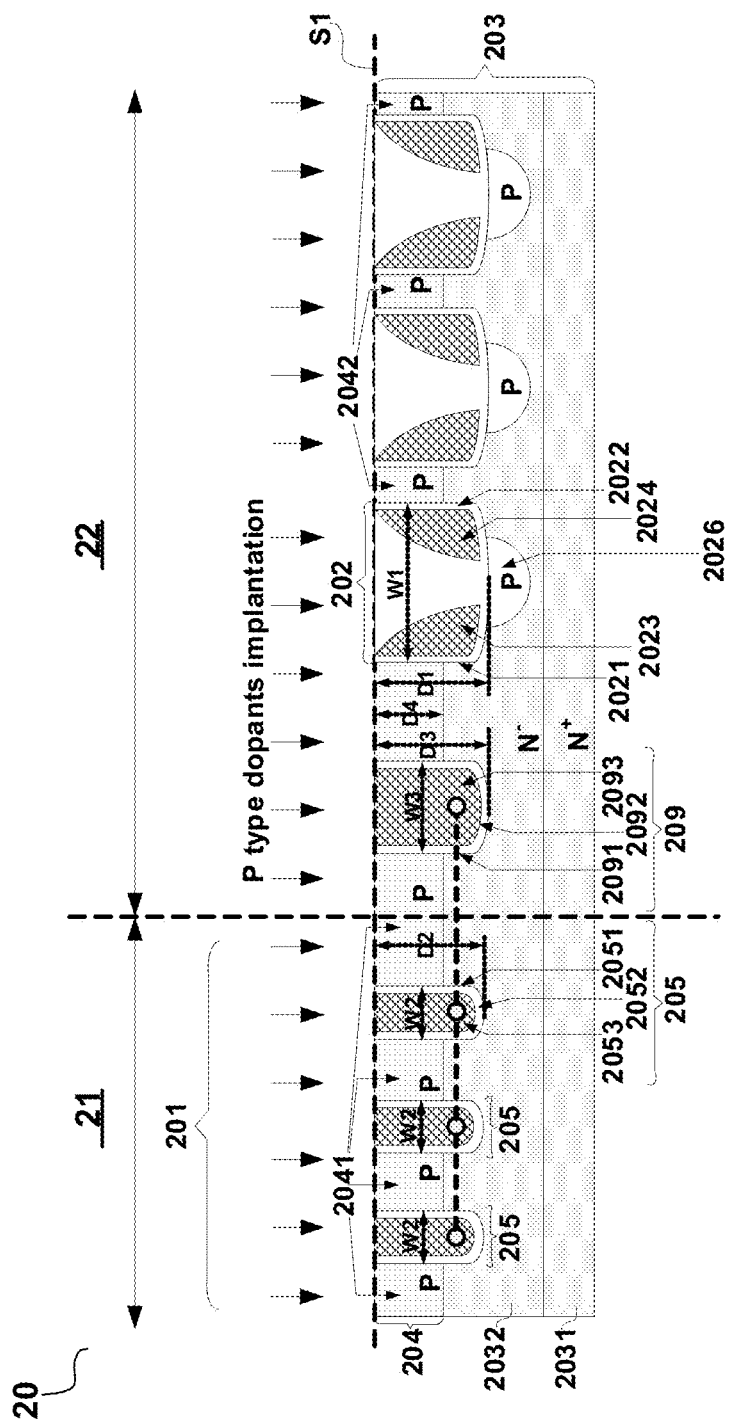
Figure 8F:
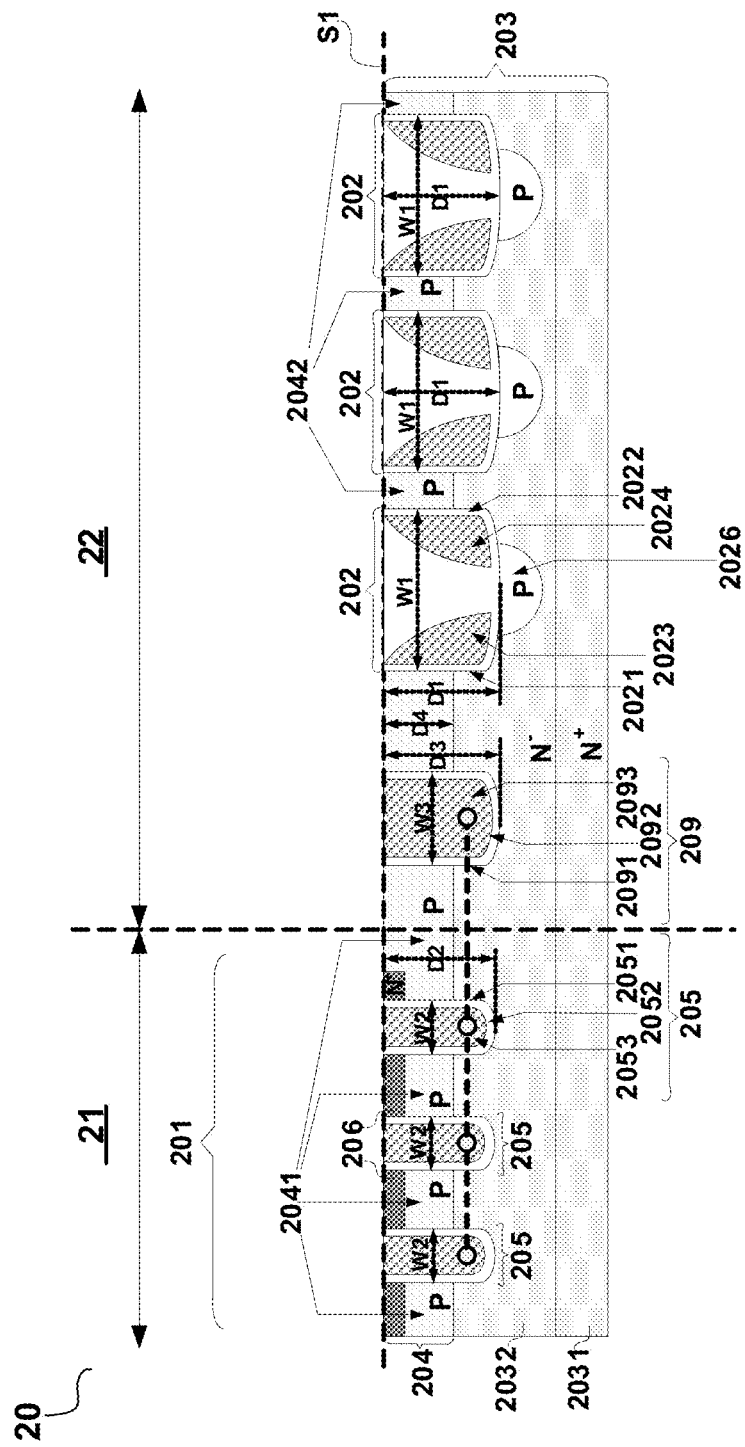
Figure 8G:
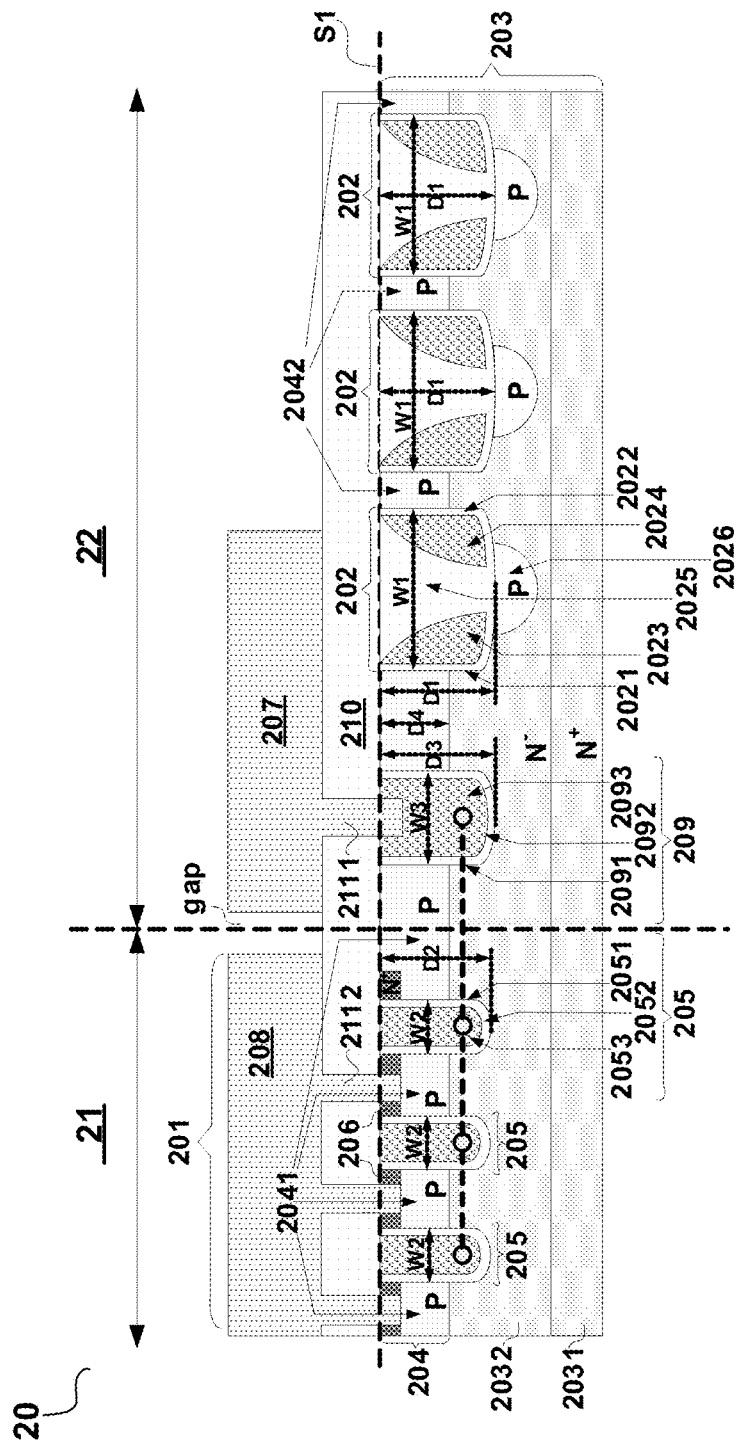

In accordance with an alternative embodiment of the present invention, referring back to the step illustrated in FIG. 8B, a transverse trench that connects the at least one runner trench 2091 to the innermost termination trench 2021 may further be formed in the same step as for forming the gate trenches 2051 or the runner trench 2091. The transverse trench may have the same structure as the gate trenches 2051 or the at least one runner trench 2091. In this exemplary embodiment, in the following step illustrated with FIG. 8C, the transverse trench is also lined with an insulation layer e.g. formed of the same insulation material as the gate insulation layer 2052, and then filled with the conduction layer. After the step of removal the extra portion of the conduction layer illustrated in FIG. 8D, a trenched transverse connection 31 (please refer to the illustration in FIG. 6) electrically connecting the gate runner 209 to the innermost termination trench 2021 is formed so that the runner conduction layer 2093 is electrically connected to the first conductive spacer 2023 of the innermost termination trench 2021. The subsequent steps as described with reference to FIGS. 8 E to 8G remain the same, and finally in this example, a FET having the same structures as those of the FET 30 illustrated in FIG. 6 is formed.

Methods and processes of forming a FET (e.g. FET 20 or FET 30) having a termination structure described in various embodiments of the present invention are illustrative and not intended to be limiting. Well known manufacturing steps, processes, materials and dopants etc. are not described in detail to avoid obscuring aspects of the technology. Those skilled in the art should understand that the steps described in the embodiments shown may be implemented in different orders and are not limited to the embodiments described.

From the foregoing, it will be appreciated that specific embodiments of the technology have been described herein for purposes of illustration, but that various modifications may be made without deviating from the technology. Many of the elements of one embodiment may be combined with other embodiments in addition to or in lieu of the elements of the other embodiments. Accordingly, the invention is not limited except as by the appended claims.

We claim:

1. A field effect transistor having an active area and a termination area outside of the active area, comprising: a semiconductor layer of a first conductivity type; a plurality of active transistor cells formed in the semiconductor layer in said active area, wherein each of the transistor cells comprises a drain region of the first conductivity type, a source region of the first conductivity type, an active body region of a second conductivity type and a gate region, and wherein the source region is located in the active body region and laterally adjacent to both sides of the gate region; a plurality of floating body regions of the second conductivity type disposed in the semiconductor layer in said termination area; at least one gate runner comprising a runner conduction layer filling a runner trench disposed in the semiconductor layer in said termination area and electrically coupled to the gate region of the plurality of active transistor cells; and a plurality of termination cells disposed interleaving with the plurality of floating body regions in the termination area, and arranged substantially in parallel from an inner side toward an outer side of the termination area; wherein each of the termination cells comprises a termination trench opened from a top surface of said semiconductor layer and having sidewalls and a bottom, wherein the termination trench includes a termination insulation layer lining the termination trench sidewalls and bottom, a first conductive spacer and a second conductive spacer located respectively against an inner sidewall and an outer sidewall among the termination trench sidewalls and spaced apart from each other, and a dielectric layer filling the space between the first conductive spacer and the second conductive spacer; and wherein each of the termination cells further comprises a guard ring region of the second conductivity type located underneath the bottom of the termination trench in the semiconductor layer, wherein the runner trench is connected to the innermost termination trench of the innermost termination cell among the plurality of termination cells, and wherein the runner conduction layer is electrically connected to the first conductive spacer of the innermost termination trench.

2. The field effect transistor of claim 1, wherein the gate region of each of the transistor cells comprises a gate trench opened from the top surface of said semiconductor layer and having sidewalls and a bottom, and wherein the gate trench includes a gate insulation layer lining the gate trench sidewalls and bottom, and a gate conduction layer filling the gate trench.

3. The field effect transistor of claim 2, wherein the runner trench is opened from the top surface of said semiconductor layer and having sidewalls and a bottom, wherein the runner trench includes a runner insulation layer lining the runner trench sidewalls and bottom, wherein the runner trench has greater trench width than the gate trench, and wherein the runner conduction layer is electrically coupled to the gate conduction layer of each of the transistor cells.

4. The field effect transistor of claim 3, wherein the runner trench is formed to intersect with the gate trench.

5. The field effect transistor of claim 3, wherein the termination trench of each of the termination cells has greater trench width than the runner trench.

6. The field effect transistor of claim 3, further comprising:
   an interlayer dielectric layer formed on the top surface of the semiconductor layer; and
   a gate metal formed on the interlayer dielectric layer, wherein the gate metal is electrically coupled to the gate runner through a first plurality of vias in the interlayer dielectric layer, and wherein the gate metal extends to overlay a substantial portion of the innermost termination trench of the innermost termination cell.

7. The field effect transistor of claim 1, wherein the semiconductor layer comprises a substrate layer and an epitaxial layer disposed on the substrate layer, wherein the substrate layer has a higher dopant concentration than the epitaxial layer, and wherein the drain region of each of the active transistor cells is disposed in the substrate layer.

8. A termination structure for a field effect transistor, wherein the field effect transistor comprises a semiconductor layer of a first conductivity type having an active area and a termination area outside of the active area, the termination structure comprising: a plurality of floating body regions of a second conductivity type disposed in the semiconductor layer in said termination area; at least one gate runner comprising a runner trench with a runner conduction layer filling the runner trench disposed in the semiconductor layer in said termination area; and a plurality of termination cells disposed interleaving with the plurality of floating body regions in the termination area, and arranged substantially in parallel from an inner side toward an outer side of the termination area; wherein each of the termination cells comprises a termination trench opened from a top surface of said semiconductor layer and having sidewalls and a bottom, wherein the termination trench includes a termination insulation layer lining the termination trench sidewalls and bottom, a first conductive spacer and a second conductive spacer located respectively against an inner sidewall and an outer sidewall among the termination trench sidewalls and spaced apart from each other with a space, and a dielectric layer filling the space between the first conductive spacer and the second conductive spacer; and wherein each of the termination cells further comprises a guard ring region of the second conductivity type located underneath the bottom of the termination trench in the semiconductor layer; and wherein the runner trench is connected to the innermost termination trench of the innermost termination cell among the plurality of termination cells, and wherein the runner conduction layer is electrically connected to the first conductive spacer of the innermost termination trench.

9. The termination structure of claim 8, wherein the runner trench is opened from the top surface of said semiconductor layer and having sidewalls and a bottom, and wherein the runner trench includes a runner insulation layer lining the runner trench sidewalls and bottom.

10. The termination structure of claim 9, wherein the termination trench of each of the termination cells has greater trench width than the runner trench.

* * * * *